United States Patent

Ebihara

[11] Patent Number: 5,806,193
[45] Date of Patent: Sep. 15, 1998

[54] TILT AND MOVEMENT APPARATUS USING FLEXURE AND AIR CYLINDER

[75] Inventor: Akimitsu Ebihara, Kanagawa, Japan

[73] Assignee: Nikon Corporation, Japan

[21] Appl. No.: 556,185

[22] Filed: Nov. 9, 1995

[51] Int. Cl.[6] .................................................. B23Q 16/00
[52] U.S. Cl. .............................. 33/1 M; 33/568; 33/573; 248/562; 248/188.2
[58] Field of Search ........................... 33/1 M, 568, 573, 33/577; 248/562, 550, 188.2, 180.1, 632, 634

[56] References Cited

U.S. PATENT DOCUMENTS

| | | | |
|---|---|---|---|
| 4,320,943 | 3/1982 | Link | 33/1 M |
| 4,559,717 | 12/1985 | Scire et al. | 33/1 M |
| 4,597,182 | 7/1986 | Rinn | 33/1 M |
| 4,770,531 | 9/1988 | Tanaka et al. | 356/358 |
| 4,887,788 | 12/1989 | Fischer et al. | 248/562 |
| 4,958,438 | 9/1990 | Hemmelgarn | 33/1 M |
| 5,207,097 | 5/1993 | Gutman | 33/573 |
| 5,280,677 | 1/1994 | Kubo et al. | 33/1 M |
| 5,360,195 | 11/1994 | Young | 248/550 |

FOREIGN PATENT DOCUMENTS

58-30128  2/1983  Japan .

*Primary Examiner*—William A. Cuchlinski, Jr.
*Assistant Examiner*—Andrew Hirshfeld
*Attorney, Agent, or Firm*—Skjerven, Morrill, MacPherson, Franklin & Friel; Norman R. Klivans

[57] ABSTRACT

A tilt and motion apparatus capable of high accuracy positioning. An upper stage is spaced apart and moved, both for vertical movement and tilting, relative to a lower stage. The upper stage is supported on the lower stage by three articulated flexures which each move in the vertical direction but are kinematically rigid in the horizontal plane. Each articulated flexure has three arms connected in a Z shape and both flexure ends are fixed to a base structure mounted on the lower stage. A voice coil motor with one element mounted on the flexure and a second cooperating element on the lower stage pushes against each flexure, which is also connected to the upper stage, away from the lower stage. Thus, the upper stage is very stiff in the horizontal direction. Additionally, at least one air cylinder is connected between the upper stage and lower stage to provide a constant counterforce to the upper stage to support its weight. This prevents the voice coil motors from having to support the weight of the upper stage, hence decreasing the heat generated by their operation.

18 Claims, 6 Drawing Sheets

TILT AND MOVEMENT APPARATUS USING FLEXURE AND AIR CYLINDER

BACKGROUND OF THE INVENTION

1. Field of the Invention

This invention relates to a positioning apparatus and specifically to a positioning apparatus allowing tilting and motion in the vertical direction of an upper platform relative to a lower platform.

2. Description of Related Art

Various support and positioning structures are well known, for use for instance in microlithographic instruments for fabrication of semiconductor devices. Typically such instruments include a stage assembly capable of movement in the X and Y directions (horizontal plane) for movement of a wafer supported thereon relative to an incident light or electron beam. In addition to X and Y direction movement, it is useful to provide Z direction (vertical) movement e.g. for focusing purposes to account for irregularities in the surface of the workpiece (such as a semiconductor wafer) which is to be exposed to the dose of the electron beam or the light through a circuit pattern of a mask. In addition to the Z direction movement of the entire wafer, it is also desirable to be able to tilt the wafer in various directions. While such Z direction motion and tilting is needed, at the same time it is important that this Z direction motion or tilting not cause any X or Y direction movement of the wafer.

Typically this is accomplished by providing an upper stage which rides on a lower stage of the stage assembly, with some sort of positioning apparatus positioned therebetween. However typically such positioning apparatuses are either extremely complicated or do not provide the desired rigidity in the X and Y directions. Also certain known positioning systems use electromagnetic positioning, sometimes combined with permanent magnets, which requires elaborate sensing and adjustments to maintain proper positioning. See, for instance, Galburt, U.S. Pat. No. 4,952,858; Trumper, U.S. Pat. No. 5,157,296; Trumper, U.S. Pat. No. 5,294,854, all incorporated herein by reference. These use what is typically referred to as a "magnetic bearing" for fine position control, which has the above-described drawbacks of requiring relatively complex sensing and feedback mechanisms as well as the further disadvantage of excessive heat dissipation.

SUMMARY

In accordance with the present invention, a stage assembly is suitable e.g. for use in a microlithographic apparatus, for example a step and repeat or a step and scan projection exposure system, an electron beam or a charged particle beam exposure system, or a proximity X-ray exposure system and provides high accuracy position and motion control for both tilt and translation. However, the present invention is not limited to the wafer stage application and is suitable for other applications where precise motion and tilting are needed relative to a plane.

In accordance with the invention, an upper stage is located spaced apart from a lower stage. The upper stage carries (in a semiconductor lithography application), a wafer chuck, interferometer mirrors and other conventional structures. Each of a set, for instance three flexures, each of which is a flat springy structure, is fastened to the perimeter of the upper stage and supports the upper stage kinematically in a horizontal plane relative to the lower stage. The flexures thereby restrict the motion of the upper stage in the vertical direction (that is, a direction orthogonal to the plane defined by the lower stage). The flexures in turn are each coupled electromagnetically to the lower stage by a voice coil motor actuator, one element of each of which is fixed to the flexure and the second cooperating element of which is fixed to the lower stage. Thus, for instance when there are three flexures spaced apart around the perimeter of the upper stage, each having its associated voice coil actuator, the upper stage may be either moved vertically relative to the lower stage or tilted relative to the lower stage. The vertical movement requires uniform movement of each of the voice coil motor actuators, while the tilting involves movement of only one or two of the actuators. Thus, the upper stage can move in a single (vertical) direction or can tilt relative to a (horizontal) plane defined by the lower stage.

In one embodiment in order to conserve power and also prevent overloading of the voice coil motor actuators, air cylinders support the weight of the upper stage on the lower stage. Thus, the voice coil motor actuators are used only for movement and do not support the weight of the upper stage. The provision of the air cylinders conserves power and hence reduces heat dissipated by the voice coil motors by providing a constant counterforce to the weight of the upper stage.

The three articulated flexures operate kinematically in the horizontal direction. In one embodiment, each articulated flexure forms a simplified Watt's linkage having three arms connected in a Z shape, with both of its ends fixed to a base structure which in turn is coupled to the lower stage. This provides straight movement of the center of the middle arm as well as very low stiffness in the vertical direction i.e. in the Z direction, with very high stiffness in the elongated arm direction perpendicular to the vertical direction i.e. in the X direction and with moderately low stiffness in the Y direction. Thus the upper stage can move in the vertical direction or can tilt relative to the horizontal plane defined by the lower stage without causing undesirable stress in the upper stage, because the three flexures form kinematic support. A linear displacement sensor associated with each flexure measures the movement of the upper stage and allows control of the air cylinders supporting the upper stage or the middle arm of the flexure and by adjusting the associated air pressure regulator in response to the displacement.

Additionally in one embodiment the upper stage includes two rigid plate layers with an elastic layer sandwiched in between, to provide a high level of damping, so that the upper stage can be controlled stably with a high control bandwidth.

DETAILED DESCRIPTION OF THE PREFERRED EMBODIMENTS

Figure 1:
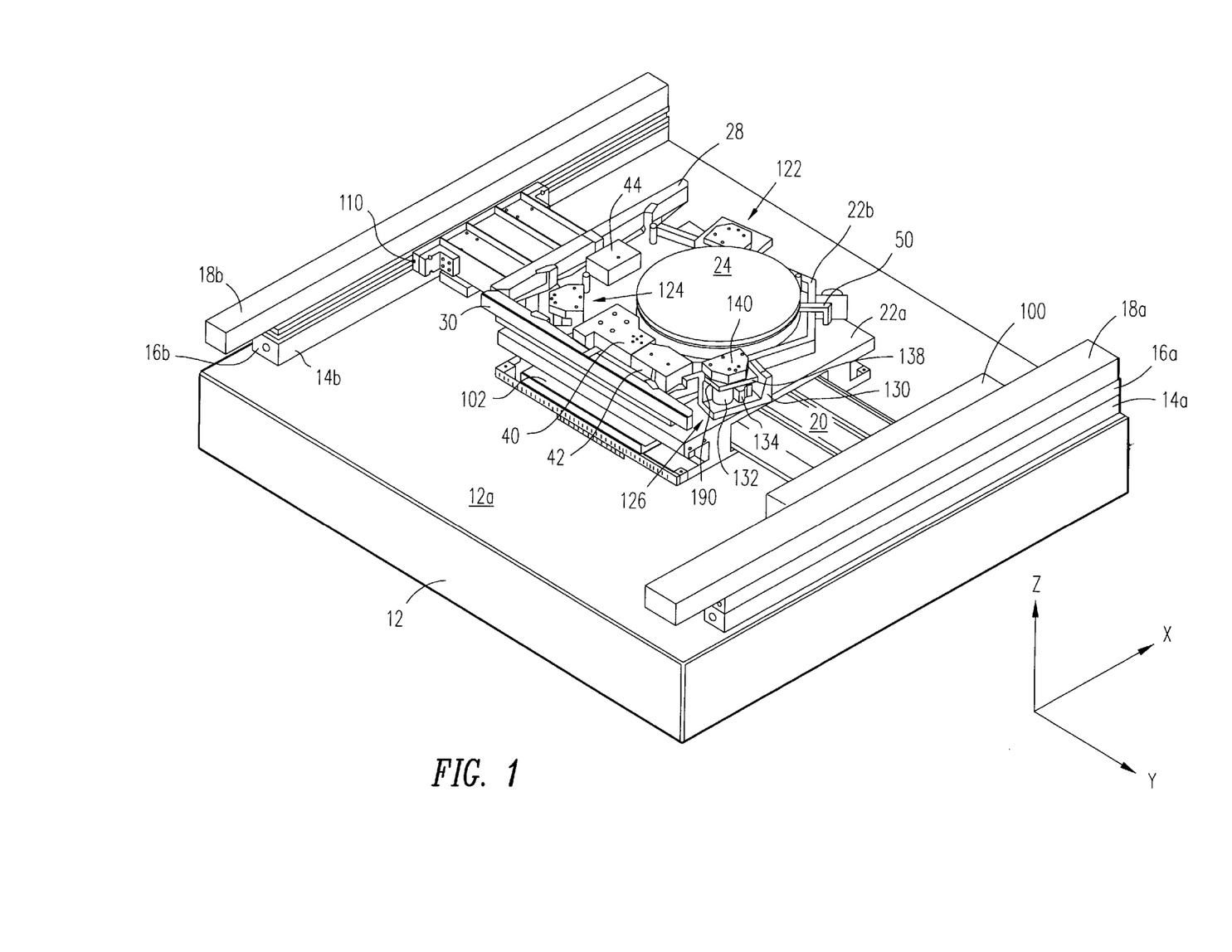
FIG. 1 shows a positioning apparatus which uses a tilt and focus mechanism in accordance with the present invention.

FIG. 1 shows a perspective view of an exemplary XY stage assembly including one embodiment of the present invention. (Axes X, Y and Z are shown for purposes of illustration but of course are not structural elements.) This structure is similar to that of commonly owned U.S. patent application Ser. No. 08/325,740, entitled "Precision Motion Stage with Single Guide Beam and Follower Stage" invented by W. Thomas Novak et al, now U.S. Pat. No. 5,623,853, issued Apr. 29, 1997. Base 12 has a flat and smooth principal surface 12a. Two fixed guides 18a and 18b spaced apart in the Y direction and parallel to each other are mounted on surface 12a of base 12.

Each of guides 18a and 18b has guiding surfaces extending in the X direction. The guiding surface of guide 18a guides an air bearing/vacuum structure 100 fixed to one end of a beam 20, to move the beam 20 in the X direction. The guiding surface in the Y direction is formed on the side surface of the beam 20, and the main stage (which includes a lower stage 22a and a upper stage 22b) moves in the Y direction along that guiding surface. Magnetic tracks 16a, 16b are mounted on the base 12 via spacers 14a, 14b respectively, and the guides 18a, 18b are disposed above magnetic tracks 16a, 16b respectively. Spacers 14a, 14b are formed into a square/rectangular pillar shape in the X direction and also provide internal cooling ducts to extract warm air from the vicinity of the magnetic track 16a, 16b.

A coil unit fixed at the lower part of the structure 100 (not shown) on one end of the beam 20 is inserted in the slot extending in the X direction of the magnetic track 16a. Similarly, a coil unit 110 fixed on the other end of the beam 20 is inserted in the slot extending in the X direction of the magnetic track 16b. Thus beam 20 moves on the surface 12a of base 12 in the X direction by provision of electric current to the coil units located at either end of beam 20. Air bearings are installed on the lower part of both ends of beam 20 and the weight of beam 20, structure 100 and the coil unit is born by the surface 12a. The lower stage 22a surrounds the beam 20 and is supported on surface 12a via air bearings.

Guide 18b guides movement in the X direction of a follower stage assembly (not shown herein for reasons of simplicity but illustrated in the above-reference patent application, incorporated by reference in its entirety) which has a rectangular frame structure. The frame of the follower stage assembly accommodates the Y direction movement of the main stage. The follower stage is supported on the base surface 12a via air bearings and has a coil unit magnetically connected with magnetic track 16b. This provides the Y direction movement of the stage 22a and structures supported thereon by means of stage coil 102 which fits into a magnetic track located on the follower stage assembly.

The lower stage 22a is typically of a relatively lightweight rigid material such as ceramic. The upper stage 22b is typically of a similar material and mounted on lower stage 22a as described below. A conventional wafer chuck 24 also typically of ceramic, and two conventional interferometer mirrors 28, 30 are mounted on upper stage 22b and the mirrors are glass or ceramic blocks having a reflecting surface. Other conventional structures mounted on upper stage 22b are fiducial marks 40 and 42 for calibrating several alignment sensors, a focus sensor and a leveling (tilting) sensor provided to the microlithographic exposure apparatus or for evaluating an image of the projection system, and illumination sensor 44 for measuring the distribution of an illumination for exposure and for detecting the projected image of the mask mark pattern. Also shown in FIG. 1 is the positioning mechanism 50 for moving the wafer chuck 24 small amounts radially relative to the lower stage 22a.

These structures shown mounted on upper stage 22b and the actual configuration of upper stage 22b can be changed to other particular designs in accordance with various types of the exposure apparatus, so FIG. 1 is merely an illustration of structures which an upper stage might support. It is also to be understood that the present invention is not limited to photolithography but is directed to the tilting and Z direction translation of upper stage 22b relative to a lower stage 22a, where these need not be stages but may be any type of platforms or structures where relative translation and tilting are needed.

This Z direction translation movement or tilting in accordance with the present invention is accomplished by three spaced-apart Z direction movement mechanisms 122, 124, and 126; each is identical. The use of three such mechanisms provides a stable triangular-type structure; in other embodiments, more or fewer such mechanisms may be provided. Mechanism 126 includes a base 130; the lower portion of base unit 130 is attached (e.g. by screws) to the upper surface of lower stage 22a. Mounted on base 130 is one element 132 of a voice coil motor (VCM) which is a well known type of electro-magnetic linear actuator. Also mounted on base 130 is a displacement sensor 134.

Corresponding and cooperating elements of both voice coil motor element 132 and displacement sensor 134 are mounted to the lower surface of a flexure 138. Both ends of flexure 138 are mounted to the posts (uprights) at either end of base unit 130. The center (flexible) portion of flexure 138 is also attached, e.g. by screws, to upper stage 22b.

In the embodiment of FIG. 1 instead of attaching flexure 138 directly to the upper stage 22b, flexure 138 is instead attached to an "outrigger" structure 140, which is typically of ceramic, for ease of mechanical assembly and stiffness. However, outrigger 140 is not necessary, and a direct attachment of flexure 138 to the upper stage 22b would also be operative, as shown in FIG. 2A.

Figure 2A:
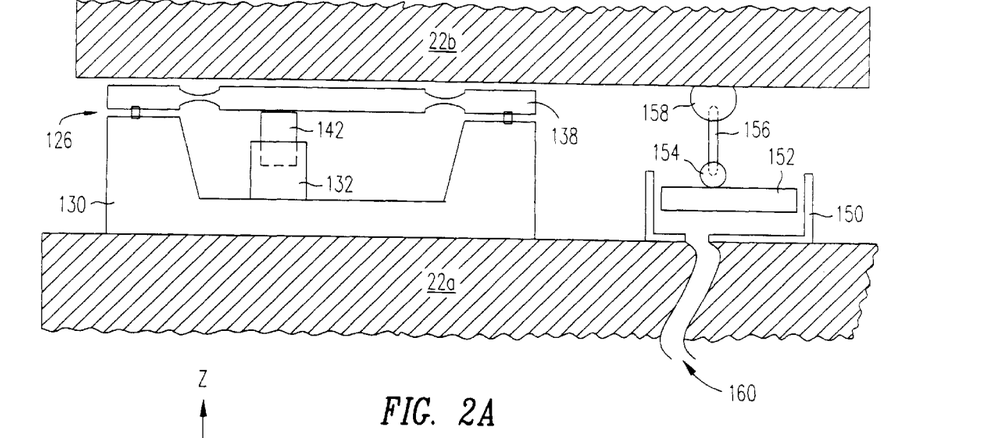
FIG. 2A is a side view of a tilt and focus mechanism in accordance with the present invention.

Thus a somewhat modified version of mechanism 126 is illustrated in FIG. 2A, not showing the fasteners connecting the upper stage 22b to flexure 138, or base unit 130 to lower stage 22a. This is a side view which also shows the second element 142 of the voice coil motor which cooperates with the first VCM element 132. It is to be understood that a voice coil motor is a two element structure including a coil, i.e. an electromagnet, and a cooperating iron structure which moves linearly inside the coil to a particular position depending on the amount of current provided to the coil. Other types of actuators may be substituted for the VCMs. (The displacement sensor is not shown in FIG. 2A for simplicity.)

Shown in FIG. 2A (but not visible in FIG. 1) is an air (fluid) cylinder structure 162 which supports the weight of upper stage 22b, thereby not requiring the voice coil motor to support the weight of upper stage 22b. (It is to be understood that air cylinder 162 is shown here in a cutaway view.) Air cylinder 162 includes a cylinder 150 which is typically (at least in its internal surfaces) a smooth, e.g. glass, material and has a cooperating smooth, e.g. graphite, cylinder 152 moving vertically within the cylinder 150.

Attached by gimbal 154 to piston 152 is one end of a connecting member (or rod) 156, the upper end of which is mounted in a second gimbal 158 which is attached to the lower surface of upper stage 22b. The gimballing of connecting rod 156 ensures that the air cylinder assembly 162 does not contribute any XY motion to upper stage 22b but instead only a vertical (Z direction) motion. It is to be understood that the configuration of FIG. 2A is illustrative and not limiting; for instance, air cylinder structure 162 alternatively is located in a recess defined in lower stage 22a. Air (or other fluid) is provided under pressure through port 160 into the cylinder 150, thereby moving piston 152 up and down within the cylinder 150, depending on the amount of pressure. Structure 162 thereby supports the weight of upper stage 22b.

In this embodiment, air cylinder structure 162 is located near the vertical movement mechanism 126; however, air cylinder structure 162 alternatively may be located spaced apart therefrom. It has been found that locating air cylinder structure 162 near to each mechanism 126 provides better motion accuracy. In one embodiment, one such air cylinder structure is provided for each mechanism 124, 126, and 122; however, this is not necessarily required. It is to be noted that the air cylinder structure 162 may be located mounted on the same base unit 130 as is the voice coil motor. In one version, air cylinder structure 162 is a commercially available component, supplied by Airpot Corporation.

Figure 2B:
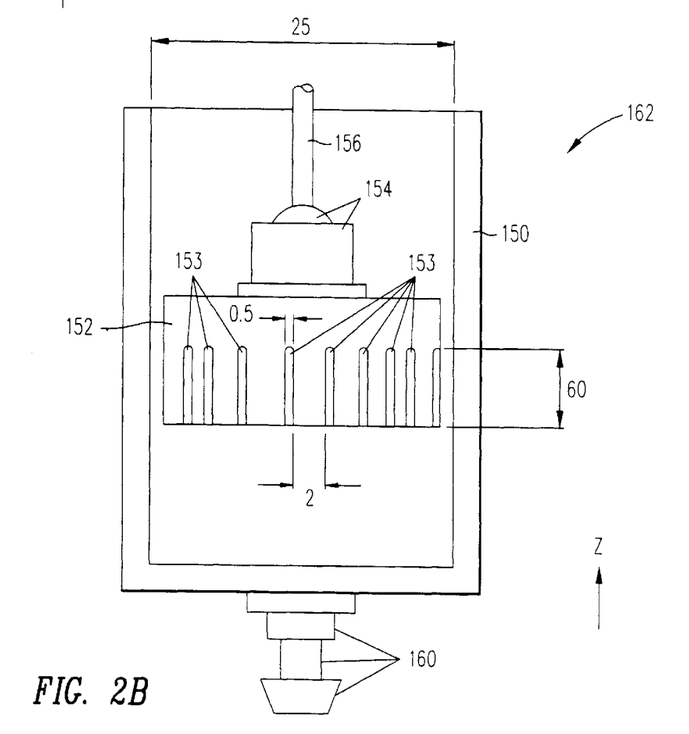
FIG. 2B shows detail of the air cylinder of FIG. 2A.

Further, in one embodiment as shown in greater detail in FIG. 2B the sides of piston 152 are scored vertically where they contact cylinder 150. This scoring is arranged in a vertical (Z) direction (in the drawing in FIG. 2B) and consists of scores 153 (grooves) each approximately 0.1 mm. deep and 0.5 mm. wide. The scores are typically spaced 2 mm. apart, for a 25 mm. diameter piston with these dimensions illustrated. These scores 153 do not extend the entire height of piston 152 because that would allow air leakage. Instead as shown they only extend approximately 60% of the height of piston 152. It is believed that this scoring redistributes the air pressure along the length of the piston 152, thereby further reducing friction. Also shown in FIG. 2B in more detail are the gimbal 154 and port 160.

Figure 2C:
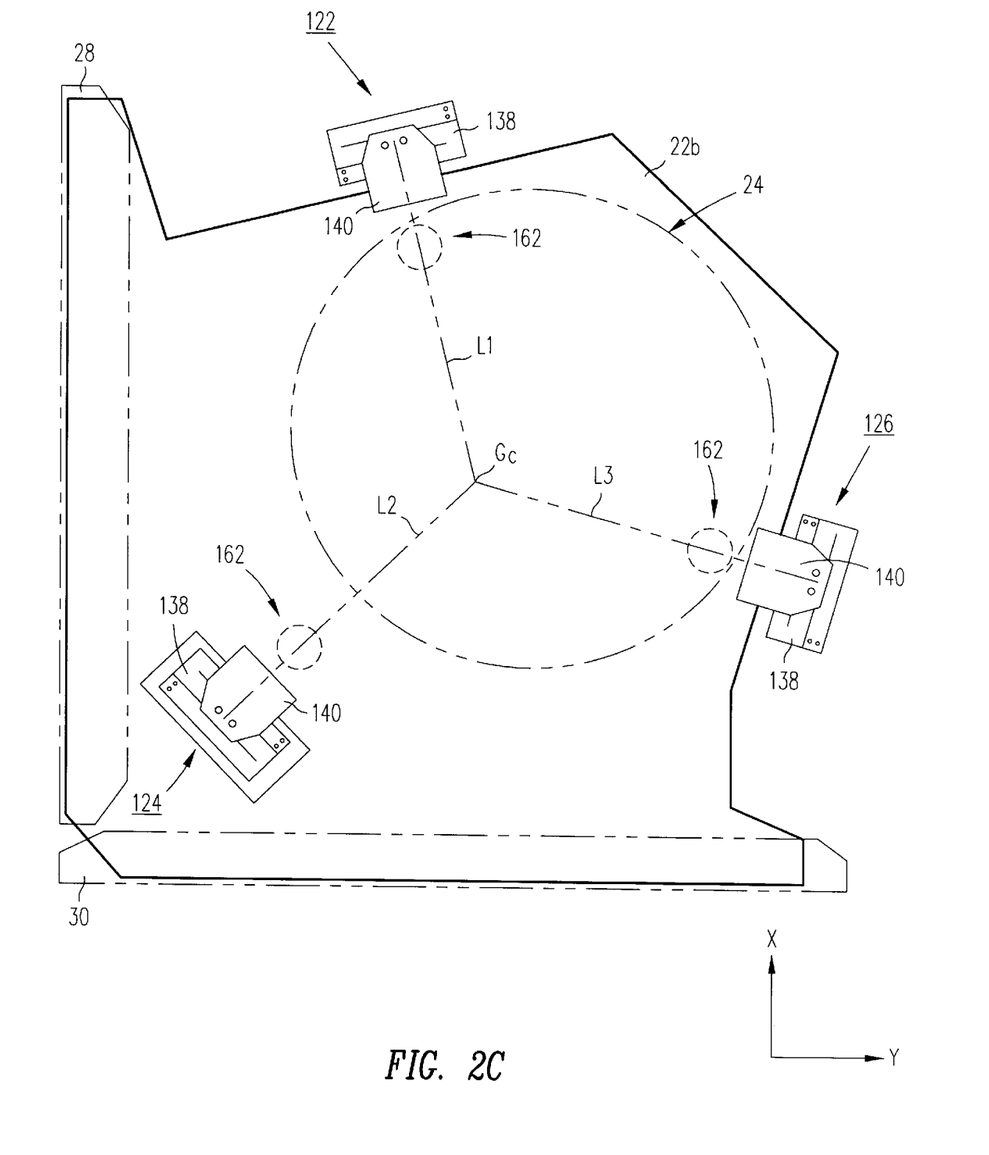
FIG. 2C shows a top view of the upper stage and associated structures including the air cylinders and flexures.

FIG. 2C shows a top view of the upper stage 22b, wafer chuck 24, three Z-direction movement mechanisms 122, 124, 126 each including the outrigger structure 140 and the flexure 138, three air cylinders 162 disposed at three different positions and the interferometer mirrors 28, 30. In FIG. 2C, each connecting position of the middle arm of the flexure 138 to the outrigger 140 is located substantially at the same distance from the center of gravity Gc of the entire upper stage on each of three lines L1, L2, L3 extending radially from the center of gravity Gc at approximately 120 degrees.

Further as shown in FIG. 2C, each flexure 138 is Z shaped so as to have three arms oriented to the tangential direction (perpendicular to the lines L1, L2, L3) in parallel to each other. The two ends of the flexure 138 are diagonally fixed to the base unit 130 (see FIG. 1). Therefor, the stiffness of the center of the flexure 138 (connecting portion with the outrigger structure 140) in the tangential direction is extremely high, the stiffness of the center of the flexure 138 in the radial direction is low to allow movement of that center approximately from several tens to hundreds of microns, and the stiffness of the center of the flexure 138 in the Z direction is extremely low to allow movement of that center approximately a few millimeters.

Because of the disposition of the three flexures 138 as shown in FIG. 2C and the stiff nature of the flexure 138 that has an extremely high translational stiffness in the XY plane achieved by the three flexures 138, the translation in the horizontal (XY) plane of the upper stage assembly 22b is prevented. Furthermore, to achieve higher positioning accuracy of tilting, it is important that the three flexures 138 lie in the same plane substantially coincident with that of a surface of the wafer chuck 24 or the wafer surface.

Figure 3:
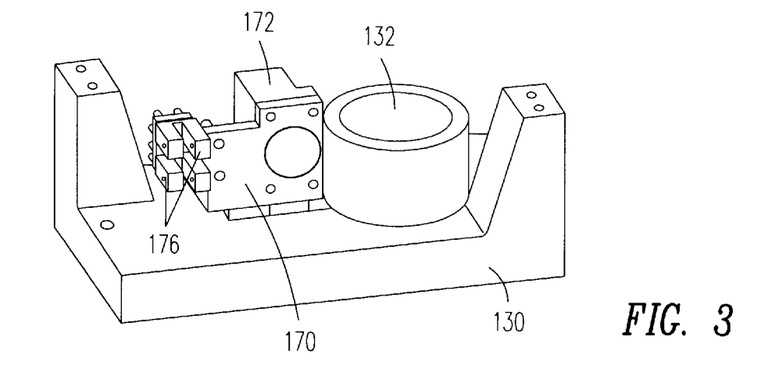
FIG. 3 shows a base unit of a single tilt and focus mechanism in accordance with the present invention, also showing part of a linear encoder.
Figure 4:
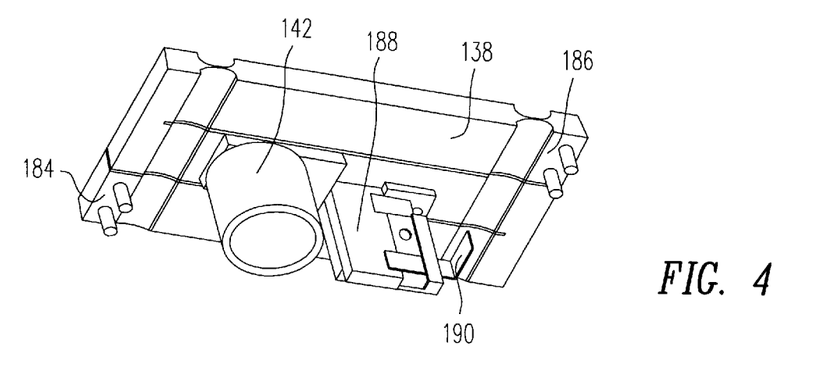
FIG. 4 shows the upper unit of a single tilt and focus mechanism in accordance with the present invention which cooperates with the base unit of FIG. 3.

Detail of mechanism 126 is shown in FIGS. 3 and 4. FIG. 3 shows the base 130 (shown here not mounted on the lower stage); fixed to base 130 is the lower (magnet) portion 132 of the voice coil motor. Also mounted on the base 130 is an encoder unit 172 which is a well known fine linear measurement device and is a part of displacement sensor 134 of FIG. 1 and which is mounted on bracket 170. Vertical motion limit switches 176 are also present.

Also shown are various screw holes for mounting the base 130 to the lower stage and for mounting the flexure 138 thereto.

The structure of FIG. 3 is better understood with reference to the cooperating structure of FIG. 4, which shows the flexure 138 to which is mounted the other (coil) element 142 of the voice coil motor. The encoder scale 188 cooperates with the linear encoder 172 of FIG. 3. Also shown is limit switch plate 190 which cooperates with limit switches 176 of FIG. 3 to limit the upper stage 22b vertical motion. Mounting base portions 184 and 186 of flexure 138 mount (by screws) to the corresponding screw holes formed in the post (upright) portions of base 130 of FIG. 3.

In the actual assembly, of course, the second (coil) element 142 of the voice coil motor fits inside magnet element 132 of FIG. 3, and encoder scale 188 bears against linear encoder 172. Also shown are the lower portions of the screws which fasten the ends of flexure 138 to the mounting posts of base unit 130.

The second element 142 of the voice coil motor and the encoder scale 188 are mounted to the bottom surface of the middle arm of the flexure 138 shown in FIG. 4. As shown in FIG. 1, the bottom surface of the outrigger structure 140 is rigidly connected to the top surface of the middle arm of the flexure 138 with a spacer block 190 to provide a predetermined space (several millimeters) between the bottom surface of the outrigger structure 140 and the top surfaces of two ends of the flexure 138.

The voice coil motor is e.g. part no. LA15-16-001A supplied by BEI Company. The linear encoder is e.g. part no. LIP401A supplied by Heidenhain Company. This is an optical sensing system; the encoded linear motion scale in this case measures steps of ten nanometers. The total travel provided by the voice coil motor is about ±1 mm in this embodiment; thus 100,000 steps are provided. (This is exemplary and not limiting.)

Figure 5:
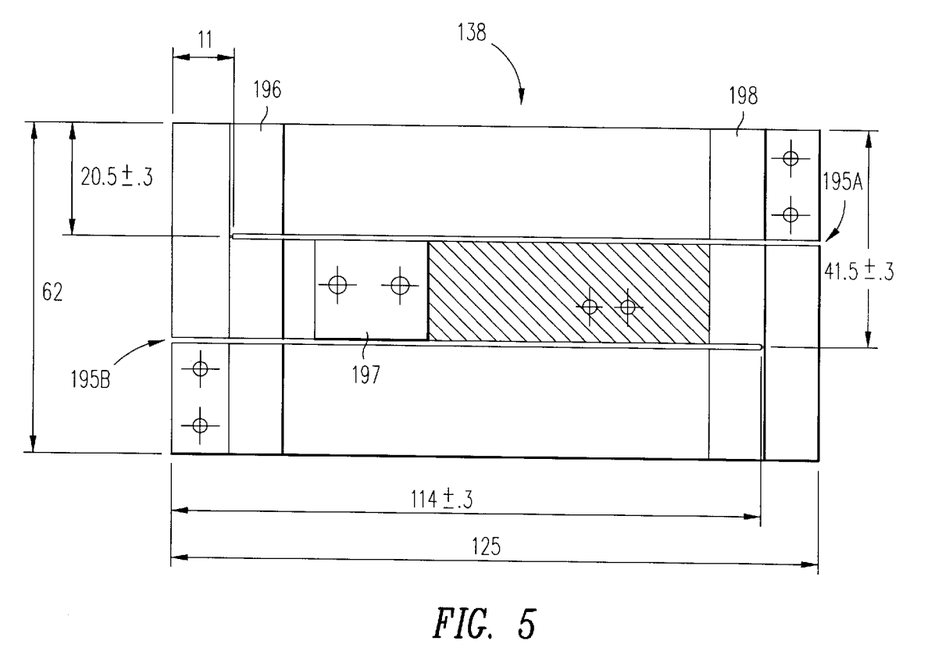
FIG. 5 shows a top view of a flexure in accordance with the present invention.
Figure 6:
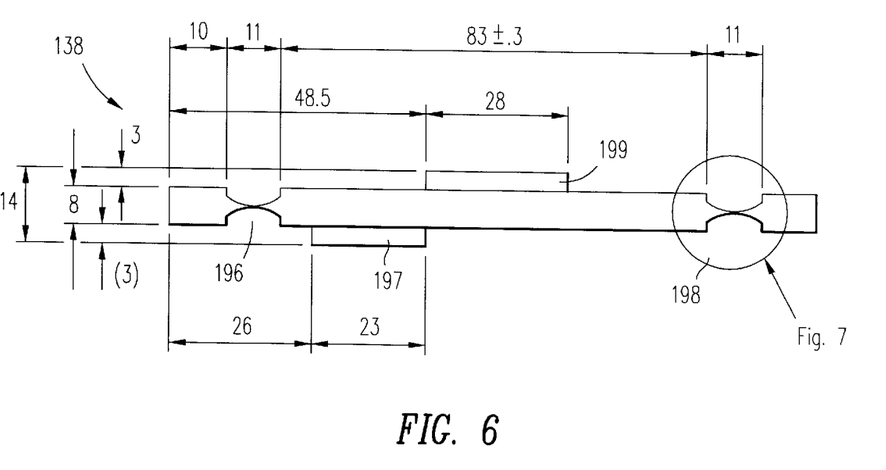
FIG. 6 shows a side view of the structure of FIG. 5.
Figure 7:
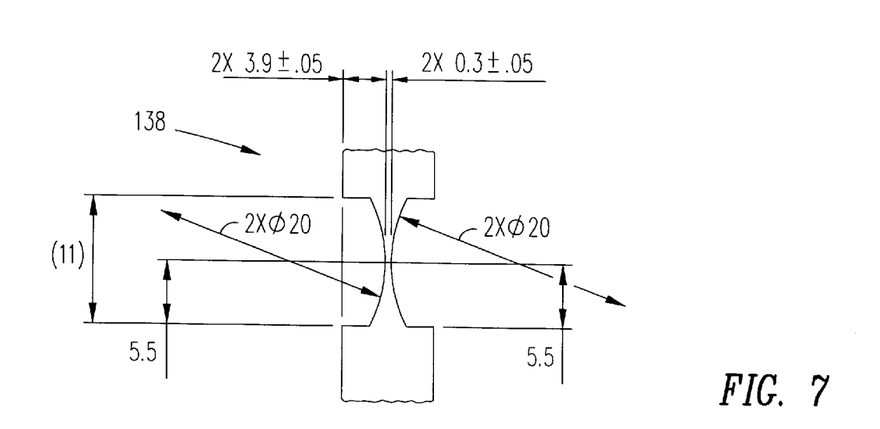
FIG. 7 shows detail of the structure of FIGS. 5 and 6.

The flexure 138 is better illustrated in various views in FIGS. 5, 6 and 7. This is a Watt's linkage type flexure, which provides single axis (vertical) movement but no movement in the orthogonal plane, i.e. is rigid in the X and Y directions. Flexure 138 is also resistant to thermal distortion due to its particular structure being point symmetrical. Because the flexure 138 is made from a monolithic metal block, a thermal change is experienced in the flexure 138 due to the heat of the coil element 142 of the voice coil motor. Expansion or contraction of the flexure 138 causes the displacement of the center of the flexure if there is no restraint. However since the flexure 138 is formed to have a point symmetrical shape and restrained by the base unit 130 at only two diagonal portions, the flexure 138 would be distorted symmetrically about the center of the middle arm, i.e. the connecting portion, with the outrigger structure 140 resulting in it being resistant to thermal distortion.

FIG. 5 shows in a top view that flexure 138 is a rectangular structure having a Z shape as determined by two long, narrow cut-outs. The ends of flexure 138, as shown by the screw holes in the left and right hand most portions in FIG. 5, are attached by screws to the posts of the base 130. Thus, the actual flexing is provided by the central flexure portion (middle arm) as defined by two thinned out portions 196, 198; these thinned out portions 196, 198 are better shown in FIG. 6. The flexure 138 is attached to the outrigger structure 140 fixed to the upper stage through the screw holes in its central spacer block portion 199 of the middle arm, four of which such screw holes are shown. Of course, this attachment arrangement is specific to this particular embodiment and not limiting. In this case, these holes are used to attach flexure 138 by screws to the outrigger 140 of FIG. 1 with the spacer block portion 199. In FIGS. 5 and 6, a mounting portion 197 is formed at the bottom of the middle arm of the flexure 138 in order to fix the second element (coil) 142 of the voice coil motor.

Various dimensions of flexure 138 (in millimeters) are shown, with tolerances, in FIGS. 5, 6 and 7; these are of course illustrative and not limiting. In this case the flexure is conventional spring steel, e.g. alloy steel E4063 which is stress relieved after machining. The actual configuration of this flexure is not critical. However, in the particular illustrative embodiment, the length of the cut-outs shown in FIG. 5 have been found to be important in terms of contributing to the actual amount of vertical motion allowed. The width of these cut-outs is not believed to be critical. The detail of FIG. 6 (shown by the circle labelled "FIG. 7") is illustrated in FIG. 7 which shows one of the actual thinned-out portions of the flexure 138 (not to be confused with the cutouts). As shown, the remaining metal at these thinned-out portions is 0.3 millimeter thick. The width of these thinned-out portions is approximately 11 millimeters and each defines (partially) a section of a sphere having a diameter as shown. However, this shape is not believed to be critical. Further, the flexure 138 has two symmetric slits 195A and 195B. The slit 195A extends to the thinned-out portion 196 and the slit 195B extends to the thinned-out portion 198 as shown in FIG. 5.

It is to be understood that other types of flexures which provide the desired stiffness in the X and Y directions, while allowing vertical flexing in the Z direction, may be substituted. Examples of such flexures are a circular plate spring or a radial flexure. Also, other types of displacement sensors may be used for the sensor 134.

The control system by which the displacement sensors provide information used by the associated air cylinders is not shown but is readily understood by one of ordinary skill in the art. The object is to first move the upper stage 22b, either vertically or tilting it relative to the lower stage 22a. The amount of this tilt or movement is determined e.g. by the optical needs of the system's optical projection portions. When the upper stage 22b is satisfactorily located by energizing one or more of the voice coil motors, its location is measured by each of the three linear encoders 172. Each linear encoder 172 then provides a signal, which is used to determine the amount of (air) pressure provided to the air cylinder assembly 162 in order to hold the upper stage 22b at that particular position, without the need for any current to be provided to the voice coil motor assembly. This conserves power and minimizes heat generation. It is to be understood that typically there are multiple mechanisms 122, 124, 126 and multiple associated air cylinders, as shown for instance in FIG. 1, and these must be coordinated in order to provide the desired support for the upper stage.

In addition, a structure of two rigid ceramic plate layers with an elastic (epoxy) layer sandwiched in between provides high damping to the upper stage, resulting in stable dynamics. The elastic layer (also called a constrained viscoelastic layer) provides shear damping. Damping here occurs by energy dissipation associated with deformation in shear in each layer where there is some storage of strain energy.

The present hybrid supporting system including the air cylinder and the voice coil motor is suitable for the wafer (sensitive plate) carrying stage assembly provided in a scanning exposure apparatus. In the scanning exposure apparatus, the wafer stage assembly is scanned in a one-dimensional direction at a constant velocity synchronized with the projected mask image. Therefore, the tilting and Z direction translation of the wafer (on the upper stage 22b) is required to have a high response for obtaining better image quality. The voice coil motor has very high bandwidth (e.g. from approximately DC to more than a few KHz). The heat dissipation of the coil unit increases when a large mass load against the actuating force is constantly provided. However in the present embodiment the load against the voice coil motor is cancelled by the air cylinder system.

Figure 8:
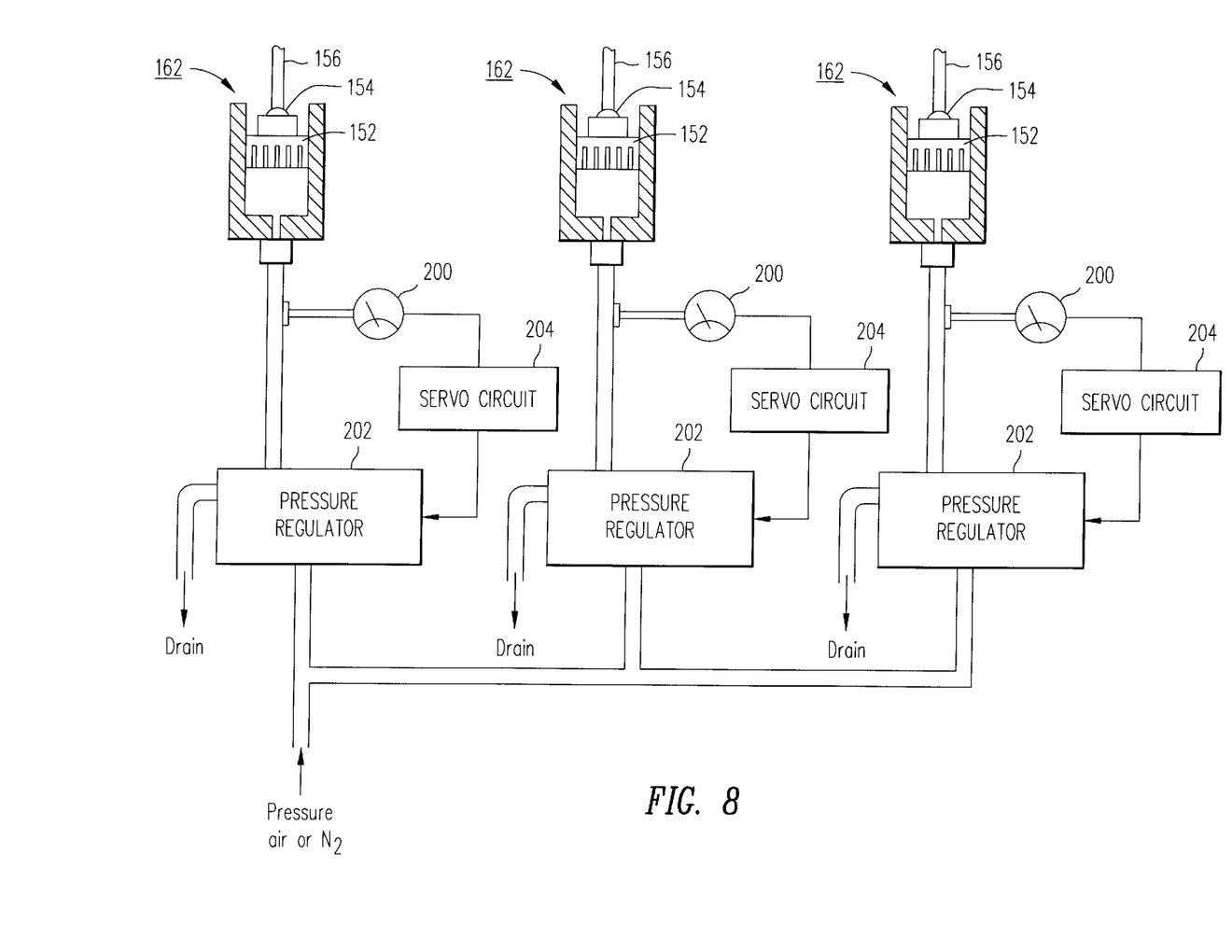
FIG. 8 shows diagrammatically control of the air cylinders.

In one application for operating this hybrid supporting system, as shown in FIG. 8, each of the three air cylinders 162 is controlled by its own pressure regulator 202 having a dynamic feedback system. In FIG. 8, the internal pressure of each air cylinder 162 is measured by a precise pressure gauge 200, and the gauged value of the pressure is fed back to the pressure regulator 202 through an electric servo-circuit (in one embodiment including a micro-controller) 204.

Each of the three regulators 202 acts to maintain the inner-pressure of the air cylinder 162 at a target value which is set to cancel the weight (load) of the whole upper stage assembly through the piston 152 and the gimbal 154 (see FIG. 2B). So, in FIG. 2B if the piston 152 of the air cylinder 162 is moved downward (or upward) by actuating the voice coil motor, the inner-pressure becomes slightly larger (smaller) and the gauged value of the pressure gauge 200 increases (decreases). In response to that, the servo-circuit 204 drives a high speed valve system provided in the regulator 202 to decrease (increase) the inner-pressure of the air cylinder 162 to the target value. The air pressure servo system always responds to the inner-pressure change of each air cylinder 162.

This disclosure is illustrative and not limiting. For instance, the flexure could have its ends attached to the upper stage and its central flexible portion attached to the lower stage with the linear actuator still pushing against the central portion. In another modification, the weight of the upper stage is supported by a combination of magnetic force and air cylinders, to reduce air pressure and the non-linearity of the magnetic force. Further modifications will be apparent to one skilled in the art in the light of this disclosure and are intended to fall within the scope of the appended claims.

I claim:

1. A positioning assembly comprising:
   a lower platform;
   an upper platform spaced apart from the lower platform;
   at least one flexure fastened to one of the upper and lower platforms and bearing against the other of the upper and lower platforms;
   a linear actuator having two cooperating elements, a first of the elements being coupled to the flexure and a second of the elements being coupled to the one of the upper and lower platform to which the flexure is fastened; and a fluid cylinder assembly coupled between the upper platform and the lower platform, thereby to support the mass of the upper platform against gravity; wherein the fluid cylinder assembly comprises:
- a cylinder mounted to the lower platform;
- a supply of fluid pressure coupled to the interior of the cylinder;
- a piston slidable in the cylinder; and
- a support member having a first end coupled to the piston and a second end coupled tot he upper platform.

2. The assembly of claim 1, wherein the linear actuator is a voice coil motor, the first element of which is one of a ferrous member and a coil, the second element being the other of the ferrous member and the coil.

3. The assembly of claim 1, wherein the support member is coupled to the piston by a first gimbal and to the upper platform by a second gimbal.

4. The assembly of claim 1, wherein an outer wall of the piston defines a plurality of grooves along a part of its length.

5. The assembly of claim 1, wherein the cylinder is of glass and the piston is of graphite.

6. The assembly of claim 1, wherein the fluid cylinder assembly is located immediately adjacent the flexure.

7. The assembly of claim 1, wherein the flexure is also fastened to the other of the upper and lower platforms.

8. The assembly of claim 1, further comprising at least two additional flexures fastened to one of the upper and lower platforms, and bearing against the other of the upper and lower platforms, and each of the additional flexures having an associated linear actuator, wherein each flexure is spaced apart from the other of the flexures.

9. The assembly of claim 1, wherein a center of the perimeter of the upper platform coincides with the center of gravity of the upper platform.

10. A positioning assembly comprising:
- an upper platform spaced apart from the lower platform;
- at least one flexure fastened to one of the upper and lower platforms and bearing against the other of the upper and lower platforms;
- a linear actuator having two cooperating elements, a first of the elements being coupled to the flexure and a second of the elements being coupled to the one of the upper and lower platform to which the flexure is fastened; and
- a scale and a cooperating linear encoder, one of the scale and encoder being mounted to the flexure and the other being mounted to the one of the upper and lower platforms to which the flexure is fastened.

11. A positioning assembly comprising:
- a lower platform;
- an upper platform spaced apart from the lower platform;
- at least one flexure fastened to one of the upper and lower platforms and bearing against the other of the upper and lower platforms; and
- a linear actuator having two cooperating elements, a first of the elements being coupled to the flexure and a second of the elements being coupled to the one of the upper and lower platform to which the flexure is fastened;
- wherein the flexure is fastened to the one of the upper and lower platforms by a mounting structure defining two posts, the flexure being mounted to the two posts.

12. A positioning assembly comprising:
- a lower platform;
- an upper platform spaced apart from the lower platform;
- at least one flexure fastened to one of the upper and lower platforms and bearing against the other of the upper and lower platforms; and
- a linear actuator having two cooperating elements, a first of the elements being coupled to the flexure and a second of the elements being coupled to the one of the upper and lower platform to which the flexure is fastened;
- wherein the flexure is a spring plate defining a thick portion at each end and a thick central portion, and having two thinner portions coupling the thick central portion to each thick end portion.

13. The assembly of claim 12, wherein the thinner portions are no greater than 0.3 mm. thick.

14. The assembly of claim 12, the flexure further defining two longitudinal cut-outs, each cut-out extending from one end of the flexure partly to the other end, each cut-out extending through both thinner portions of the flexure.

15. The assembly of claim 12, wherein the thicker portions at each end of the flexure are both fastened to one of the upper and lower platforms, and the central portion is fastened to the other of the upper and lower platforms.

16. A positioning assembly comprising:
- a lower platform;
- an upper platform spaced apart from the lower platform;
- at least one flexure fastened to one of the upper and lower platforms and bearing against the other of the upper and lower platforms; and
- a linear actuator having two cooperating elements, a first of the elements being coupled to the flexure and a second of the elements being coupled to the one of the upper and lower platform to which the flexure is fastened;
- wherein the flexure includes a Watt's linkage structure.

17. A method of moving and tilting an upper platform relative to a lower platform, the upper platform being spaced apart from the lower platform, comprising the steps of:
- locating each one of a plurality of flexures each including a Watt's linkage to kinematically support the upper platform on the lower platform;
- supporting by fluid pressure the mass of the upper platform on the lower platform; and
- electromagnetically moving the upper platform relative to the lower platform independently at at least three spaced-apart locations at a perimeter of the upper platform, thereby moving the upper platform relative to the lower platform.

18. A positioning assembly comprising:
- a lower platform;
- an upper platform spaced apart from the lower platform;
- at least one flexure fastened to one of the upper and lower platforms and bearing against the other of the upper and lower platforms;
- a linear actuator having two cooperating elements, a first of the elements being coupled to the flexure and a second of the elements being coupled to the one of the upper and lower platform to which the flexure is fastened; and
- a fluid cylinder assembly coupled between the upper platform and the lower platform, thereby to support the mass of the upper platform against gravity, wherein the fluid cylinder assembly includes a support member coupled to a remainder of the fluid cylinder assembly by a first gimbal and to the upper platform by a second gimbal.

* * * * *